(12) United States Patent
Funato et al.

(10) Patent No.: US 7,364,950 B2
(45) Date of Patent: Apr. 29, 2008

(54) SEMICONDUCTOR DEVICE AND METHOD OF MANUFACTURING THE SAME

(75) Inventors: Norihide Funato, Himeji (JP); Masataka Nanba, Shiso-Gun (JP); Hiroshi Sawano, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/551,383

(22) Filed: Oct. 20, 2006

(65) Prior Publication Data

US 2007/0052075 A1 Mar. 8, 2007

Related U.S. Application Data

(63) Continuation of application No. 11/119,745, filed on May 3, 2005, now Pat. No. 7,230,322, which is a continuation of application No. 10/686,587, filed on Oct. 17, 2003, now Pat. No. 6,903,450, which is a continuation of application No. PCT/JP02/03829, filed on Apr. 17, 2002.

(30) Foreign Application Priority Data

Apr. 18, 2001 (JP) .............................. 2001-120309

(51) Int. Cl.
*H01L 21/00* (2006.01)
(52) U.S. Cl. .......................................... 438/123; 228/6
(58) Field of Classification Search ................ 438/123; 257/676; 228/6, 102; 361/717, 719
See application file for complete search history.

(56) References Cited

U.S. PATENT DOCUMENTS

| | | | |
|---|---|---|---|
| 3,840,978 A * | 10/1974 | Lynch et al. ............. | 228/110.1 |
| 4,151,945 A * | 5/1979 | Ragard et al. ............... | 228/6.2 |
| 5,218,231 A | 6/1993 | Kudo | |
| 5,977,630 A | 11/1999 | Woodworth et al. | |
| 6,040,626 A | 3/2000 | Cheah et al. | |
| 6,193,130 B1 * | 2/2001 | Ushiki et al. ................. | 228/6.2 |
| 6,319,755 B1 | 11/2001 | Mauri | |
| 6,465,276 B2 | 10/2002 | Kuo | |
| 6,572,005 B2 * | 6/2003 | Minamitani et al. ..... | 228/110.1 |
| 6,849,930 B2 | 2/2005 | Nakajima et al. | |
| 6,873,041 B1 | 3/2005 | Crowley et al. | |

FOREIGN PATENT DOCUMENTS

| | | |
|---|---|---|
| EP | 1 191 589 | 3/2002 |
| JP | 59-48947 | 3/1984 |

(Continued)

*Primary Examiner*—Roy Potter
(74) *Attorney, Agent, or Firm*—Oblon, Spivak, McClelland, Maier & Neustadt, P.C.

(57) ABSTRACT

A semiconductor device is provided including a semiconductor element having a plurality of electrodes, a plurality of bonding portions of a lead frame, a plate-like current path material which electrically connects at least one of the plurality of electrodes and one of the plurality of bonding portions, a housing which packages the semiconductor element having the plurality of electrodes, the plurality of bonding portions of the lead frame, and the current path material, wherein the plate-like current path material is arranged to be directly bonded to one of the plurality of electrodes and one of the plurality of bonding portions, and the middle portion of the current path material is formed apart from the surface of the semiconductor element. A method of manufacturing the same is also provided.

10 Claims, 12 Drawing Sheets

FOREIGN PATENT DOCUMENTS

| | | |
|---|---|---|
| JP | 4-180640 | 6/1992 |
| JP | 06-268027 | 9/1994 |
| JP | 9-283574 | 10/1997 |
| JP | 10-261756 | 9/1998 |
| JP | 11-103003 | 4/1999 |
| JP | 2000-114445 | 4/2000 |
| JP | 2000-124269 | 4/2000 |
| JP | 2000-183099 | 6/2000 |
| JP | 2000-243784 | 9/2000 |
| JP | 2001-35983 A | 2/2001 |
| WO | WO 01/15216 | 3/2001 |

* cited by examiner

SEMICONDUCTOR DEVICE AND METHOD OF MANUFACTURING THE SAME

CROSS-REFERENCE TO RELATED APPLICATIONS

This is a Continuation of and claims the benefit of priority under 35 USC §120 from U.S. Ser. No. 11/119,745, filed May 3, 2005, which is a Continuation Application of U.S. Ser. No. 10/686,587, filed Oct. 17, 2003, which is a Continuation Application of PCT Application No. PCT/JP02/03829, filed Apr. 17, 2002, which was not published under PCT Article 21(2) in English.

This application is based upon and claims the benefit of priority under 35 USC §119 from the prior Japanese Patent Application No. 2001-120309, filed Apr. 18, 2001, the entire contents of which are incorporated herein by reference.

BACKGROUND OF THE INVENTION

1. Field of the Invention

The present invention relates to a semiconductor device and a method of manufacturing the same and, more particularly, to a current path material for electrically connecting an electrode formed in a semiconductor device, e.g., the source electrode of a semiconductor element and the connecting portion of a lead frame, and a method of connecting the source electrode and the connecting portion of the lead frame by using the current path material.

2. Description of the Related Art

Many types of semiconductor devices have recently been shipped as products. One of these semiconductor devices is a semiconductor device called a MOSFET 101 sealed in an SOP-8 package, as shown in FIG. 1. A conventional semiconductor device and a method of manufacturing the same will be explained by exemplifying the MOSFET 101 sealed in an SOP-8 package.

As shown in FIG. 1, the MOSFET 101 is sealed by a mold resin 102 made of an epoxy resin or the like. As the name of the SOP-8 package implies, the MOSFET 101 has eight lead frame terminals 103. The lead frame terminals 103 are exposed outside the mold resin 102 such that the lead frame terminals 103 are grouped into four to face each other on both sides of the mold resin 102.

The main part of the internal structure of the MOSFET 101 is constituted as shown in FIGS. 2A and 2B. FIG. 2A is a sectional view showing the MOSFET 101 taken along the line A-A in FIG. 1. FIG. 2B is a sectional view showing the MOSFET 101 taken along the line B-B in FIG. 1. Of the eight lead frame terminals 103, the four lead frame terminals 103 on one side are combined into one within the mold resin 102, as shown in FIG. 2A. As shown in FIGS. 2A and 2B, the four lead frame terminals combined into one are arranged within the mold resin 102 so as to be electrically connected from a side (upper side in FIG. 2A or left side in FIG. 2B) opposite to a source electrode 104s and gate electrode 104g of a semiconductor element 104.

As shown in FIGS. 2A and 2B, the remaining four lead frame terminals 103 are arranged within the mold resin 102 so as not to be directly connected to the semiconductor element 104 including the source electrode 104s and gate electrode 104g and the four lead frame terminals 103 combined into one. Of the remaining four lead frame terminals 103, three lead frame terminals 103 on the source side are combined into one, as shown in FIG. 2A. The remaining one lead frame terminal 103 on the gate side is electrically separated from the three source side lead frame terminals 103 combined into one.

In the MOSFET 101 having this internal structure, the source electrode 104s of the semiconductor element 104 and the three source side lead frame terminals 103 combined into one are electrically connected by a plurality of bonding wires 105 made of a metal such as aluminum (Al) or gold (Au). Similarly, the gate electrode 104g of the semiconductor element 104 and the remaining one gate side lead frame terminal 103 are electrically connected by one bonding wire 106.

The recent MOSFET 101 is being improved in speed and performance, while being decreased in power consumption and operation voltage. In other words, the recent MOSFET 101 is being so designed as to exhibit higher performance at lower voltage. To meet these contradictory demands, the recent MOSFET 101 tends to be set to a low internal resistance (ON resistance) in the entire device including circuits along with micropatterning of the circuit.

If the internal resistance of the MOSFET 101 is decreased to follow this trend, the influence of the resistances of the bonding wires 105 and 106 on the internal resistance of the whole MOSFET 101 including the semiconductor element 104 cannot be ignored. To decrease the internal resistance of the MOSFET 101, the resistances of the bonding wires 105 and 106 must be decreased.

To decrease the resistances of the bonding wires 105 and 106, for example, the metal material of the bonding wires 105 and 106 is changed to another metal lower in resistance than Al or Au. This method restricts the kind of usable metal, and cannot greatly reduce the resistances of the bonding wires 105 and 106.

Merely changing the metal material of the bonding wires 105 and 106 cannot improve the performance of the MOSFET 101. It is very difficult to further improve a power MOSFET by reducing the internal resistance.

As another method of decreasing the resistances of the bonding wires 105 and 106, for example, the sectional areas of the bonding wires 105 and 106 may be increased. This method suffers various technical difficulties: spatial restriction considering the diameters of the bonding wires 105 and 106 and the numbers of bonding wires 105 and 106, the possibility of electrical short-circuits between the bonding wires 105 and 106, and poor bonding strength when pluralities of bonding wires 105 and 106 are bonded to the small-area source electrode 104s, gate electrode 104g, and lead frame connecting portions.

To solve these technical difficulties and decrease the resistance of the MOSFET 101, a MOSFET 111 has been developed. In the MOSFET 111, as shown in FIGS. 3A and 3B, the source electrode 104s through which a larger current (main current) flows than that through the gate electrode 104g, and the three source side lead frame terminals 103 combined into one are electrically connected using a current path material 107 (to be referred to as a strap 107 hereinafter) made of a flat plate-like (band-like) metal instead of a plurality of bonding wires 105.

In the MOSFET 111, the source electrode 104s and the three source side lead frame terminals 103 combined into one are connected by the flat plate-like strap 107. The sectional area of the current path between the source electrode 104s and the source side lead frame terminals 103 is larger than that of the MOSFET 101 in which the source electrode 104s and the lead frame terminals 103 are connected by a plurality of bonding wires 105. That is, in the MOSFET 111, the resistance between the source electrode 104s and the source side lead frame terminals 103 is reduced to reduce the resistance of the entire device.

Similar to the above-described bonding wires 105 and 106, the strap 107 is connected to the source electrode 104s and source side lead frame terminals 103 by conductive connecting materials such as cured conductive materials or solder. The MOSFET 111 having this structure is disclosed in, e.g., Jpn. Pat. Appln. KOKAI Publication No. 2000-114445.

In general, bonding materials such as cured conductive materials or solder used inside a semiconductor device readily generate failures with respect to temperature changes. To evaluate this failure mode, the MOSFET 111 undergoes a temperature cycle test a plural number of times in an environment where the temperature steeply changes. In this state, brittleness, cracking, and the like appear inside the cured conductive material or solder and near the interfaces between the source electrode 104s, lead frame terminals 103, and strap 107 and the cured conductive material or solder. The endurance of the MOSFET 111 having the strap 107 connected by the cured conductive material, solder, or the like upon temperature changes can be evaluated.

The strap 107 which is formed into a flat plate and connected to the source electrode 104s by the cured conductive material, solder, or the like exhibits an unstable electrical connection state at microscopic level. More specifically, a chip edge touch where the strap 107 touches the peripheral portion of the semiconductor element (semiconductor chip) 104 readily occurs at a portion Z in FIG. 3B, i.e., outside the source electrode 104s. As a result, an electrical short-circuit easily occurs between the strap 107 and the peripheral portion of the semiconductor element 104.

In this way, the electrical performance of the MOSFET 111 with this internal structure is unstable. More specifically, initial short-circuit failures occurred in 18.5% of the total number of MOSFETs 111 manufactured as samples.

It is an object of the present invention to provide a highly endurable semiconductor device which can operate at low power consumption and exhibits stable electrical performance, and a method of manufacturing the same.

BRIEF SUMMARY OF THE INVENTION

To overcome the conventional drawbacks, according to an aspect of the present invention, there is provided a semiconductor device comprising: a semiconductor element having a plurality of electrodes; a plurality of bonding portions of a lead frame; a plate-like current path material which electrically connects at least one of the plurality of electrodes and one of the plurality of bonding portions; and a housing which packages the semiconductor element having the plurality of electrodes, the plurality of bonding portions of the lead frame, and the current path material, wherein the plate-like current path material is arranged to be directly bonded to one of the plurality of electrodes and one of the plurality of bonding portions, and a middle portion of the current path material is formed apart from a surface of the semiconductor element, and wherein the middle portion of the current path material is formed into an arch shape having a predetermined curvature.

According to another aspect of the present invention, there is provided a method of manufacturing a semiconductor device, comprising: forming a semiconductor element; forming a plate-like current path material which connects at least one of a plurality of electrodes of the semiconductor element and one of a plurality of bonding portions of a lead frame; forming the current path material so as to space a middle portion of the plate-like current path material apart from a surface of the semiconductor element; forming the middle portion of the current path material into an arch shape having a predetermined curvature; and electrically directly bonding two end portions of the current path material at one of the plurality of electrodes and one of the plurality of bonding portions of the lead frame.

DETAILED DESCRIPTION OF THE INVENTION

A semiconductor device and a method of manufacturing the same according to embodiments of the present invention will be described below with reference to the several views of the accompanying drawing.

First Embodiment

A semiconductor device according to the first embodiment will be described with reference to FIGS. 4, 5A, and 5B. The first embodiment will exemplify a MOSFET (power MOSFET) 1 sealed into an SOP-8 package and will explain its structure in detail.

Figure 4:
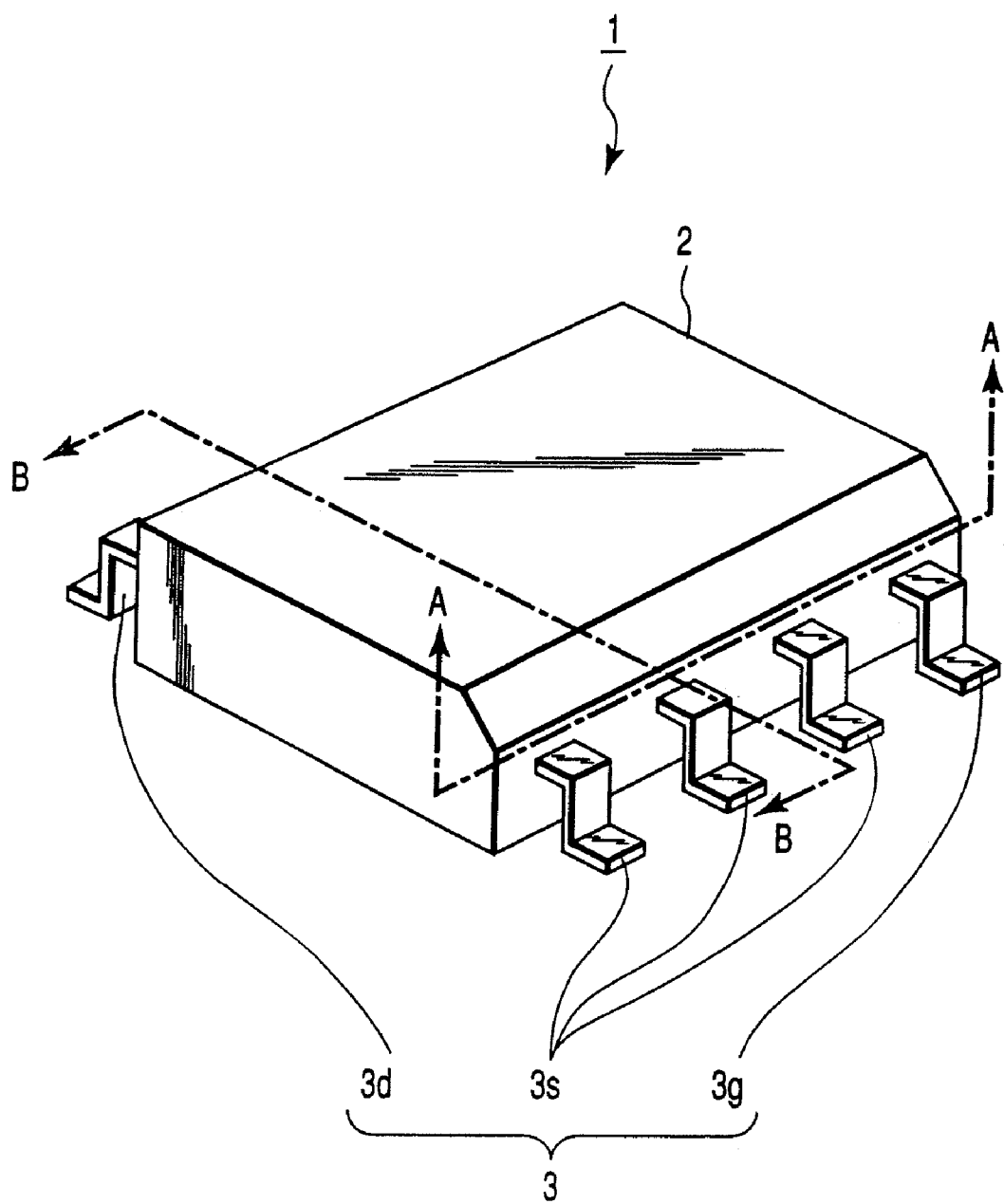
FIG. 4 is a perspective view showing the outer appearance of a semiconductor device according to the first embodiment of the present invention.

FIG. 4 is a perspective view showing the outer appearance of the MOSFET 1. FIG. 5A is a sectional view showing the internal structure of the MOSFET 1 in FIG. 4 taken along the line A-A. FIG. 5B is a sectional view showing the internal structure of the MOSFET 1 in FIG. 4 taken along the line B-B.

Figure 5A:
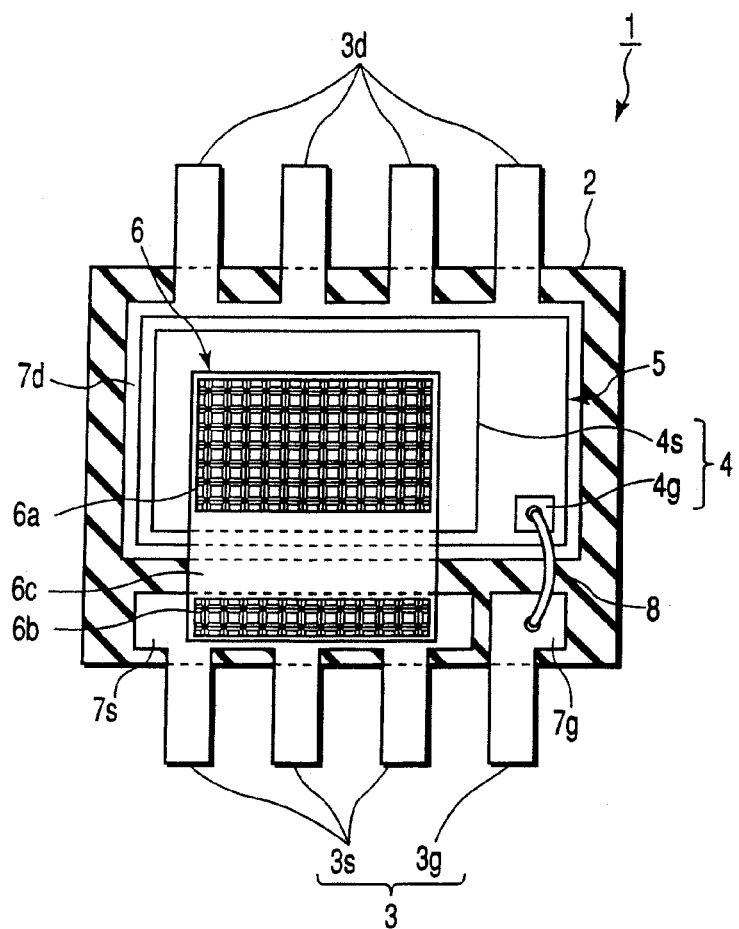
FIG. 5A is a sectional view showing the internal structure of the semiconductor device in FIG. 4 taken along the line A-A.
Figure 5B:
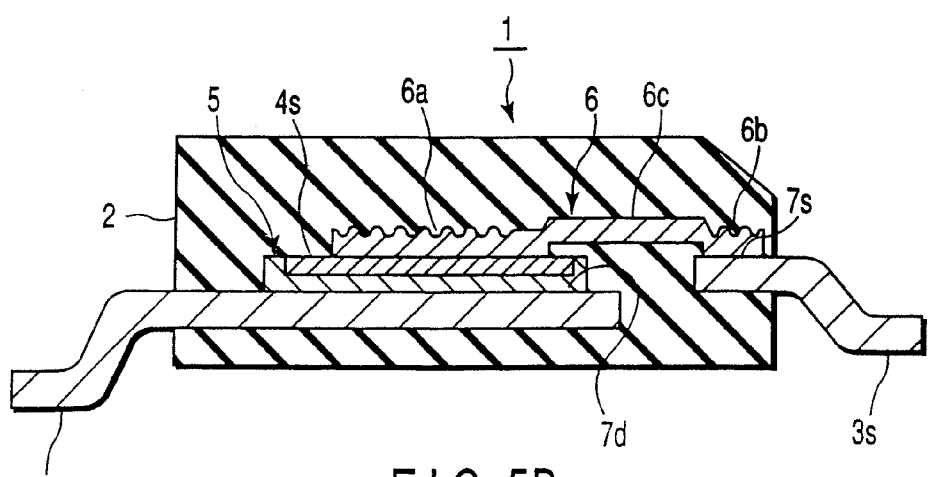
FIG. 5B is a sectional view showing the internal structure of the semiconductor device in FIG. 4 taken along the line B-B.

The MOSFET 1 shown in FIGS. 5A and 5B comprises a semiconductor element 5 having a plurality of electrodes 4, a plurality of lead frame terminals 3, a plate-like current path material 6 which bonds at least one of the plurality of electrodes 4 and at least one of a plurality of lead frame bonding portions 7s and 7g, and a housing 2 which packages the plurality of lead frame terminals 3, semiconductor element 5, current path material 6, and the like.

The plurality of electrodes 4 include a source electrode 4s and gate electrode 4g. The plurality of lead frame terminals 3 include three source side lead frame terminals 3s combined into one, and one gate side lead frame terminal 3g. The drain electrode of the MOSFET 1 is connected to four drain side lead frame terminals 3d combined into one on the back surface of the semiconductor element 5.

The source side lead frame terminals 3s are combined at a source side bonding portion 7s (to be referred to as a source side post 7s hereinafter) of the lead frame. The gate side lead frame terminal 3g is connected at a gate side bonding portion 7g (to be referred to as a gate side post 7g hereinafter) of the lead frame.

As shown in FIG. 5B, the current path material 6 is formed such that the lower surface of a middle portion 6c between a portion 6a bonded to the source electrode 4s and a portion 6b bonded to the source side post 7s is spaced apart from the upper surface of the semiconductor element 5. In addition, the current path material 6 is directly bonded to the upper surfaces of the source electrode 4s and source side post 7s.

By supersonic bonding, the current path material 6 is directly bonded at its two end portions (6a and 6b) to the source side post 7s and source electrode 4s serving as part of the interconnection of the semiconductor device. The current path material 6 is made of Al series materials. The current path material 6 is connected between the source side post 7s and at least the source electrode 4s out of the electrodes 4 of the semiconductor element 5. The current path material 6 functions as a part of the interconnection of the semiconductor device.

As shown in FIG. 4, the MOSFET 1 is covered with the housing 2 molded by, e.g., an epoxy series mold resin. The SOP-8 package has eight lead frame terminals 3. These lead frame terminals 3 are exposed outside the housing 2 such that the lead frame terminals 3 are grouped into four to face each other on both sides of the housing 2. Of the eight lead frame terminals 3, only five lead frame terminals 3 are illustrated in FIG. 4, and the remaining three lead frame terminals 3 are omitted.

The main part of the internal structure of the MOSFET 1 will be explained in detail with reference to FIGS. 5A and 5B. As shown in FIGS. 5A and 5B, of the eight lead frame terminals, the four lead frame terminals 3d on one side are combined into one by a flat plate-like drain side post 7d connected to the drain electrode on the back surface of the semiconductor element 5 inside the housing 2. The four lead frame terminals 3d combined into one are arranged inside the housing 2 so as to be electrically connected to the drain electrode (drain pad) on the back surface of the chip on one side opposite to the other side where the source electrode (source pad) 4s and gate electrode (gate pad) 4g of the semiconductor element (semiconductor chip) 5 are arranged. That is, the four lead frame terminals 3d combined into one are used as the drain terminal of the MOSFET 1.

The drain side lead frame terminals 3d are arranged in plane surface connection to the drain electrode on the back surface of the chip at the flat plate-like drain side post 7d which combines these four terminals 3d. Between the semiconductor element 5 and the drain side lead frame terminals 3d, the drain electrode on the back surface of the chip and the drain side post 7d are so fixed as to be electrically plane-surface-connected to each other by conductive connecting materials such as cured conductive materials or solder.

As shown in FIG. 5A, of the eight lead frame terminals, the remaining four lead frame terminals 3 (3s and 3g) on the other side are arranged inside the housing 2 so as not to be directly connected to the semiconductor element 5 having the source electrode 4s and gate electrode 4g. The four lead frame terminals 3 are electrically disconnected from the four drain side terminals 3d including the drain side post 7d. Of the four lead frame terminals 3, the three source side lead frame terminals 3s are combined into one. The remaining one gate side lead frame terminal 3g is electrically disconnected from the three source side lead frame terminals 3s combined into one.

The three source side lead frame terminals 3s combined into one are connected to the source electrode 4s of the semiconductor element 5 by the current path material 6 (to be described later) via the source side post 7s. The three source side lead frame terminals 3s combined into one are used as the source terminal of the MOSFET 1.

The remaining one gate side lead frame terminal 3g is connected to the gate electrode 4g of the semiconductor element 5 by one bonding wire 8. In other words, the remaining one gate side lead frame terminal 3g is connected to the gate electrode 4g via the bonding wire 8 at the flat plate-like gate side post 7g, and used as the gate terminal of the MOSFET 1.

As described above, the MOSFET 1 sealed into the SOP-8 package substantially has three terminals. The semiconductor element 5 of the MOSFET 1 has three electrodes 4 (the source electrode 4s, the gate electrode 4g, and the drain electrode (not shown) on the back surface of the chip). In the MOSFET 1, the source side lead frame terminals 3s substantially serving as one of the three terminals, and the source electrodes 4s serving as another one of the three electrodes 4 are selectively connected via the current path material 6.

As shown in FIGS. 5A and 5B, the current path material 6 is plane-surface-bonded to the source electrode 4s at the electrode side bonding portion 6a. Further, the current path material 6 is plane-surface-bonded to the source side post 7s at the post side bonding portion 6b.

The current path material 6 is formed such that the lower surface of the middle portion (beam portion) 6c is spaced apart from the upper surface of the semiconductor element 5. The current path material 6 formed in this manner according to the present invention will be called a bonding strap 6.

In the bonding strap 6, the electrode side bonding portion 6a is plane-surface-bonded to the semiconductor element 5 within only the area of the source electrode 4s. The middle portion 6c between the electrode side bonding portion 6a and the lead frame side bonding portion 6b is spaced apart from the upper surface of the semiconductor element 5. Thus, the MOSFET 1 can completely avoid any electrical short-circuit caused by a chip edge touch in the prior art. The bonding strap 6 is directly plane-surface-bonded to both the source electrode 4s and source side post 7s simultaneously by supersonic bonding.

In the MOSFET 1 having the bonding strap 6, the sectional area of a current path between the source electrode 4s of the semiconductor element 5 and the source side post 7s of the lead frame becomes much larger than the total sectional area of current paths through a plurality of bonding wires 105 in the conventional MOSFET 101. In the MOSFET 1, the resistance between the source electrode 4s and the source side lead frame terminals 3s becomes much lower than that in the MOSFET 101.

More specifically, in the MOSFET 1 of the first embodiment, the chip size of the semiconductor element 5 is 3.79 mm×2.65 mm, and the bonding strap 6 is 2.0 mm in width and 0.1 mm in thickness. Since the bonding strap 6 is made of Al, the bonding strap 6 will be called an Al bonding strap 6 hereinafter.

Figure 1:
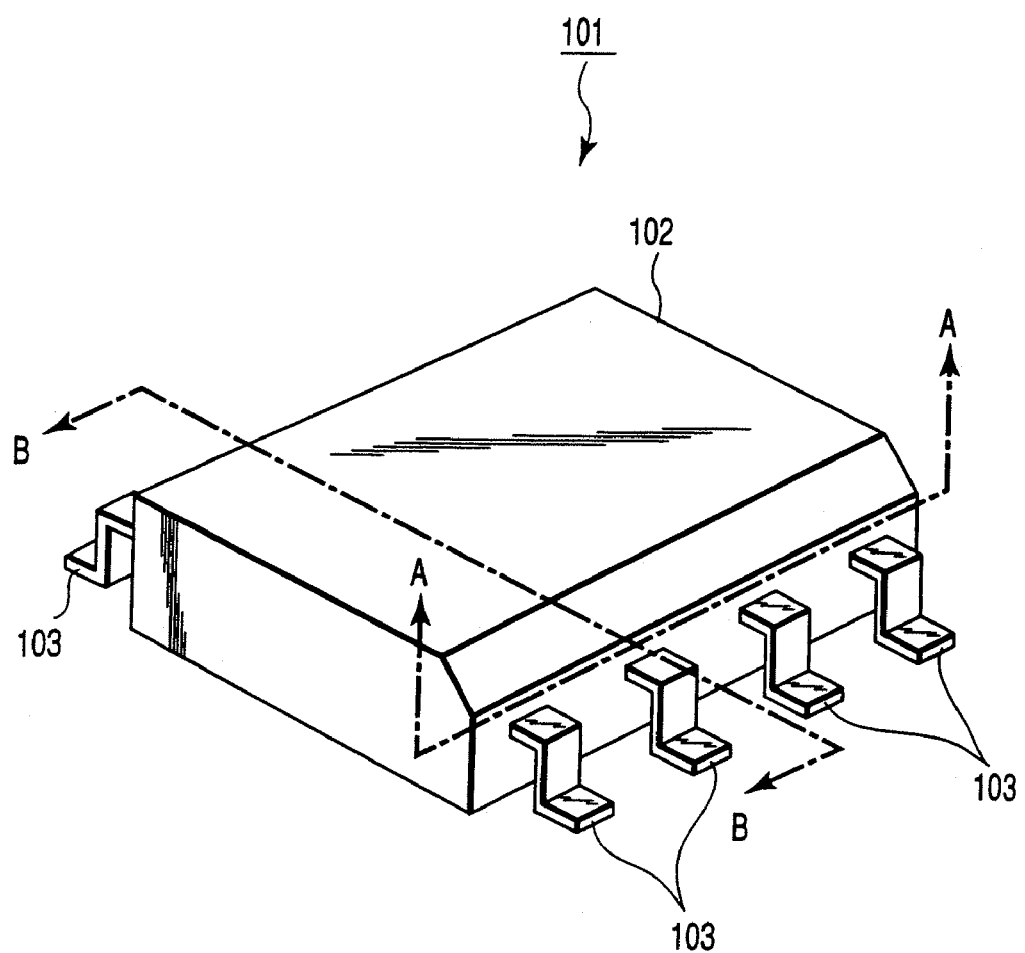
FIG. 1 is a perspective view showing the outer appearance of a conventional semiconductor device.
Figure 2A:
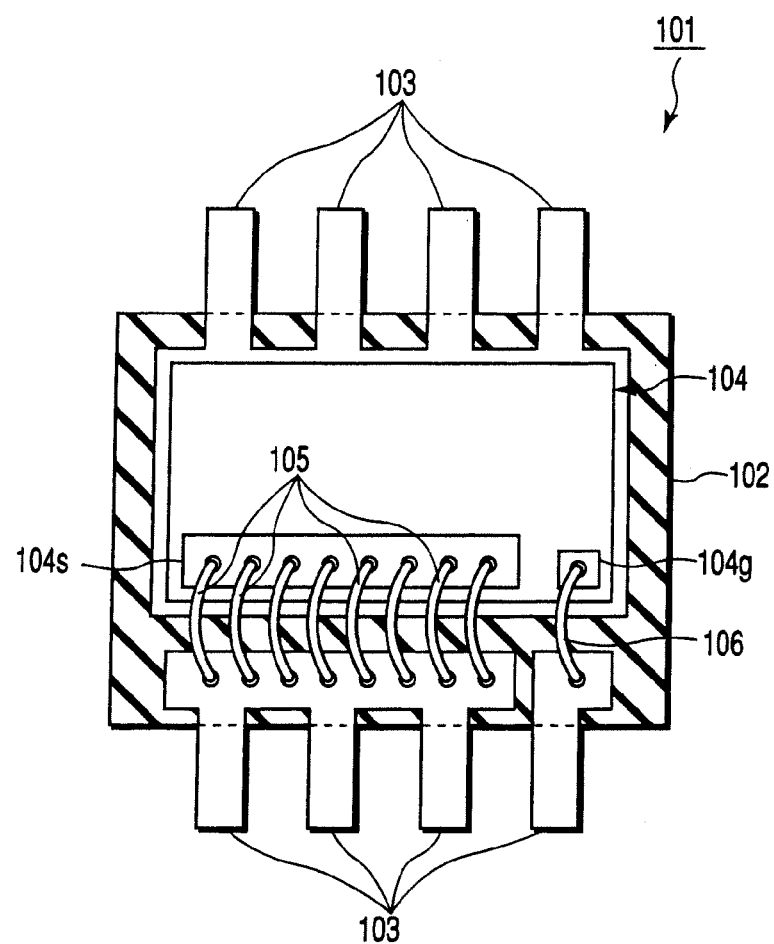
FIG. 2A is a sectional view showing the internal structure of the conventional semiconductor device in FIG. 1 taken along the line A-A.
Figure 2B:
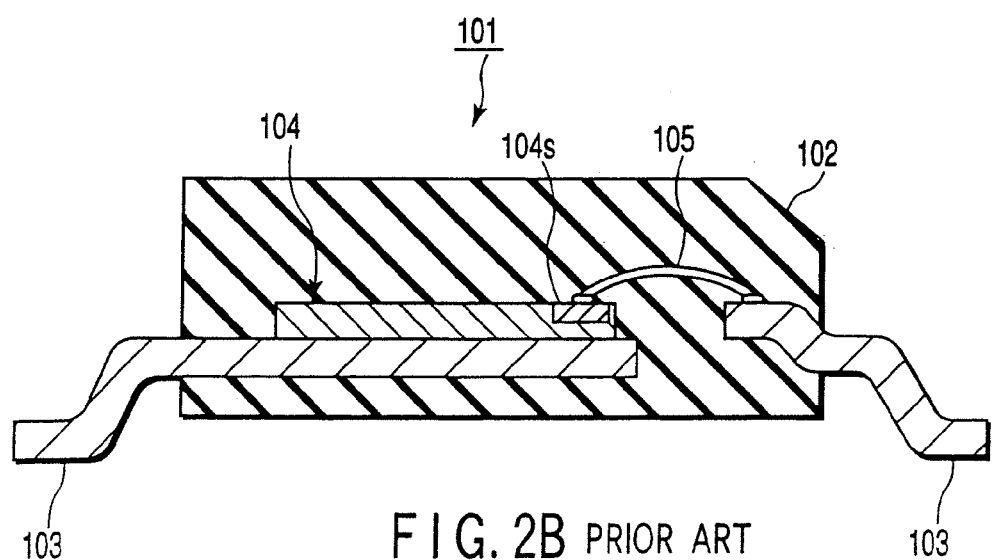
FIG. 2B is a sectional view showing the internal structure of the conventional semiconductor device in FIG. 1 taken along the line B-B.
Figure 3A:
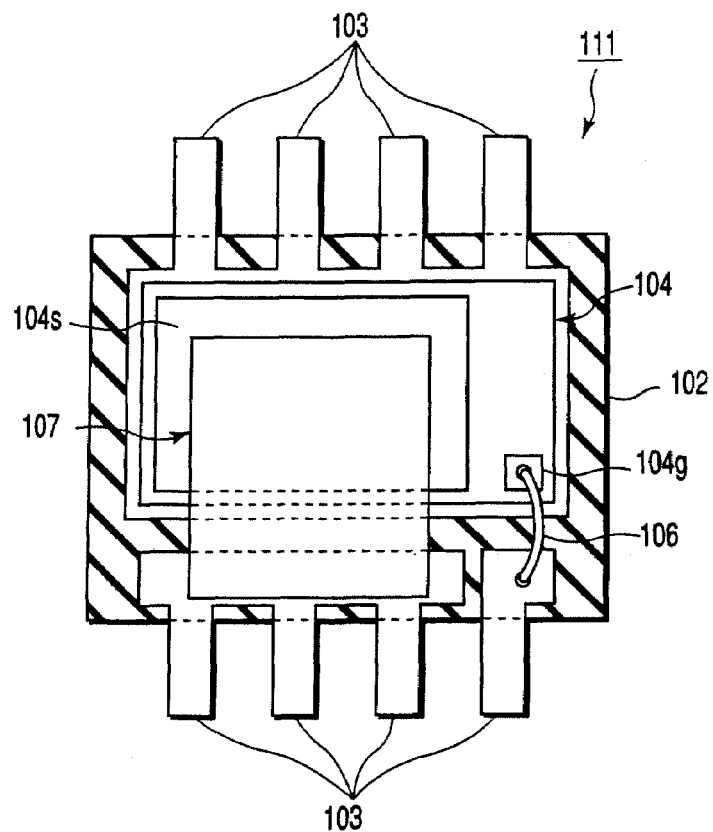
FIG. 3A is a sectional view showing another internal structure of the conventional semiconductor device in FIG. 1 taken along the line A-A.
Figure 3B:
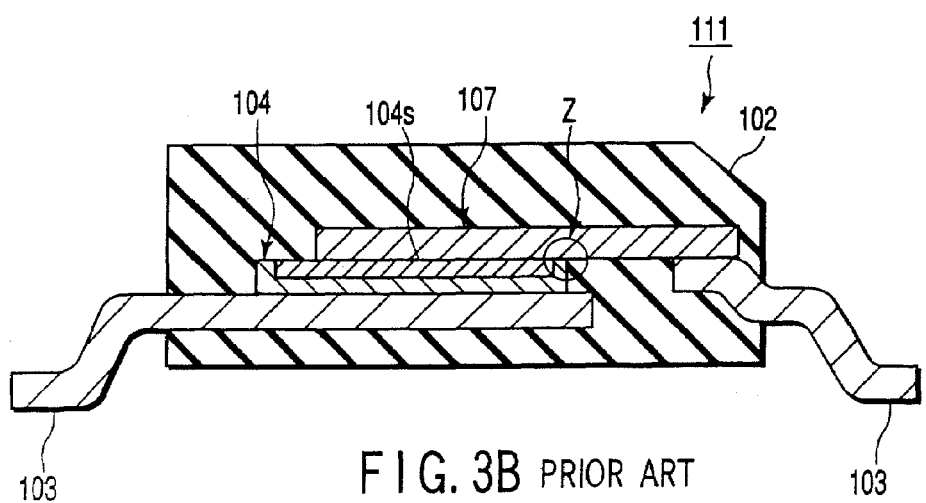
FIG. 3B is a sectional view showing another internal structure of the conventional semiconductor device in FIG. 1 taken along the line B-B.

In the conventional MOSFET 101, the chip size is 3.79 mm×2.65 mm, which is the same as in the MOSFET 1 of the first embodiment. However, the source electrode and the source side lead frame terminals are connected using about 10 of 60-μmφ Au bonding wires 105 (FIG. 2A shows eight bonding wires 105).

Figure 6:
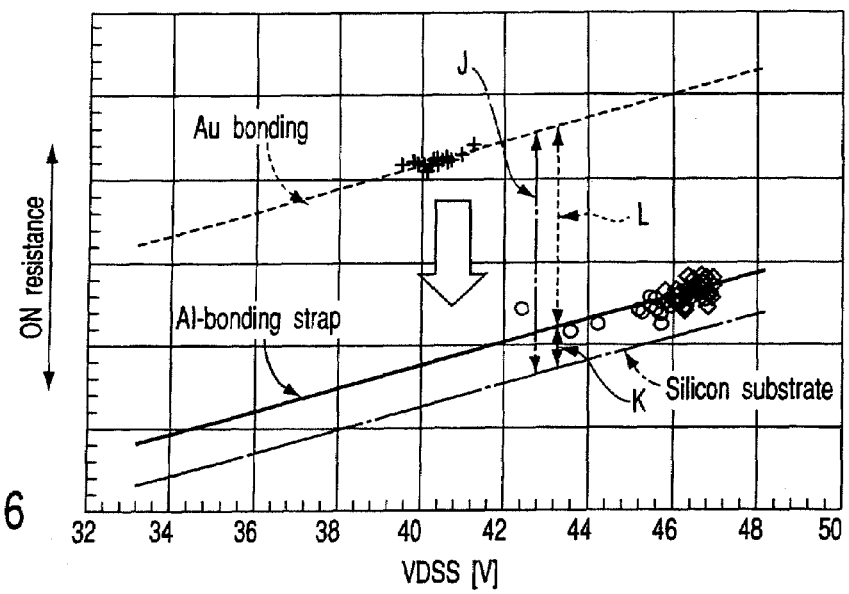
FIG. 6 is a graph showing a comparison between the ON resistance of a current path material in FIG. 4 and that of a conventional current path material.

The resistance value measurement experiment conducted by the present inventors reveals that in the conventional MOSFET 101 having the above-mentioned structure, the average of the ON resistance (internal resistance Ron) as a function of a voltage VDSS changes as represented by the broken line in FIG. 6. In the MOSFET 1 of the first embodiment having the Al bonding strap, the average of the ON resistance as a function of the voltage VDSS changes as represented by the solid line in the graph of FIG. 6.

The voltage VDSS is a drain-source breakdown voltage of the MOSFET.

In the MOSFET 1 of the first embodiment and the conventional MOSFET 101, the average of the resistance as a function of the voltage VDSS on a silicon substrate (pellet) changes as represented by the chain line in the graph of FIG. 6. As shown in FIG. 6, the resistances of the silicon substrates of the MOSFETs 1 and 101 change with almost the same gradient with respect to the magnitude of the voltage VDSS.

In FIG. 6, the resistances of the silicon substrates in the MOSFETs 1 and 101 change parallel to each other by the difference between absolute values. By comparing the difference, the resistance value can be obtained.

The difference between the ON resistance of the entire MOSFET 101 and that of the entire MOSFET 1 is almost constant within a range indicated by a chain arrow J in FIG. 6. The difference between the ON resistance of the entire MOSFET 1 and the resistance of the silicon substrate in the MOSFET 1 is almost constant within a range indicated by a solid arrow K in FIG. 6. From this, the difference between the wiring resistance of the 10 parallel bonding wires 105 in the MOSFET 101 and that of the Al bonding strap 6 in the MOSFET 1 is almost constant within a range indicated by a broken line L in FIG. 6.

As described above, according to the resistance measurement results shown in FIG. 6 by the present inventors, the wiring resistance of the Al bonding strap 6 in the MOSFET 1 is greatly reduced by about 80% from the wiring resistance of the 10 parallel bonding wires 105 in the MOSFET 101 regardless of the value of the voltage VDSS. In other words, the ratio of the wiring resistance of the Al bonding strap 6 to the ON resistance of the whole MOSFET 1 is very low in the MOSFET 1 of the first embodiment.

Figure 7A:
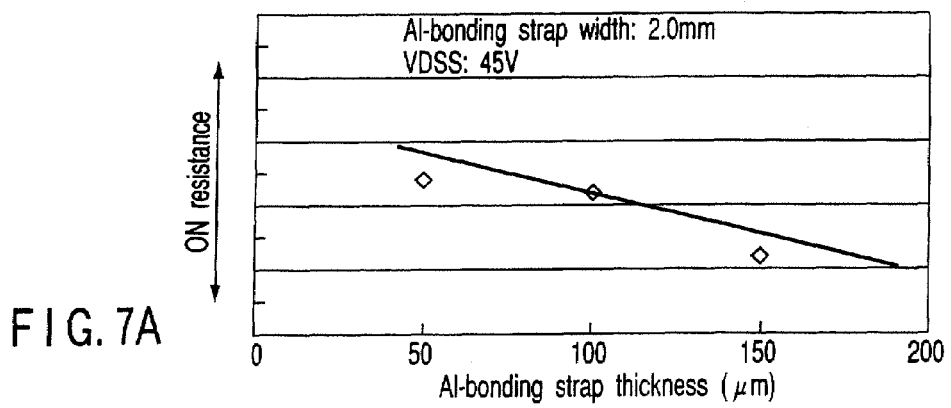
FIG. 7A is a graph showing the dependence of the ON resistance of the current path material in FIG. 4 on the Al bonding strap thickness.
Figure 7B:
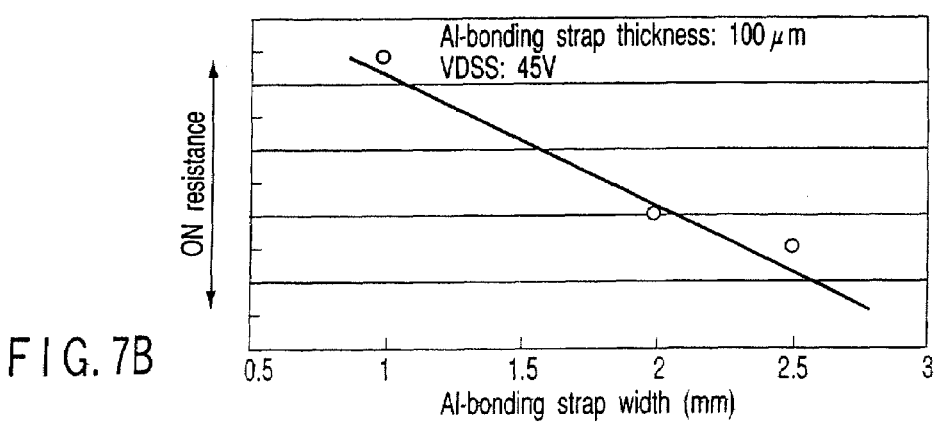
FIG. 7B is a graph showing the dependence of the ON resistance of the current path material in FIG. 4 on the Al bonding strap width.

The resistance of the Al bonding strap 6 of the MOSFET 1 as a function of the strap thickness and width changes as represented by the solid lines in FIGS. 7A and 7B. The use of the Al bonding strap 6 can prevent processing size errors in strap thickness and width from degrading the electrical performance of the MOSFET 1 with the semiconductor element 5 having the above-mentioned size in terms of practical use. By using the Al bonding strap 6 according to this embodiment, the electrical performance can be maintained at high level in practical use without decreasing the operation speed of the MOSFET 1.

The Al bonding strap 6 of the first embodiment is directly bonded and fixed to the source electrode 4s of the semiconductor element 5 and the source side post 7s by supersonic bonding without using any cured conductive material, solder, or the like.

For this reason, the MOSFET 1 is almost free from any brittleness or cracking caused by changes in external environment such as temperature changes near the interfaces between the cured conductive material or solder, and the source electrode 4s of the semiconductor element 5, the source side post 7s, the Al bonding strap 6, and the like.

The MOSFET 1 having the Al bonding strap 6 directly bonded to the source electrode 4s of the semiconductor element 5 and the source side post 7s by supersonic bonding endures changes in external environment such as temperature changes. The MOSFET 1 attains highly reliable electrical performance.

More specifically, a temperature cycle test in which the temperature was steeply and largely changed a plural number of times, e.g., successively 100 times to 400 times by every 100 times within the temperature range of −40° C. to 150° C. was conducted for the MOSFET 1 of the present invention having the Al bonding strap 6, the conventional MOSFET 101 (to be referred to as conventional A) in which the source electrode and source side post were bonded using 10 of 60-μmϕ Au bonding wires, and another conventional MOSFET (to be referred to as conventional B), slightly different from the MOSFET 1, in which a Cu strap was connected to the source electrode of a semiconductor element by using solder. Then, the reliability test of the electrical performance was performed.

Figure 8:
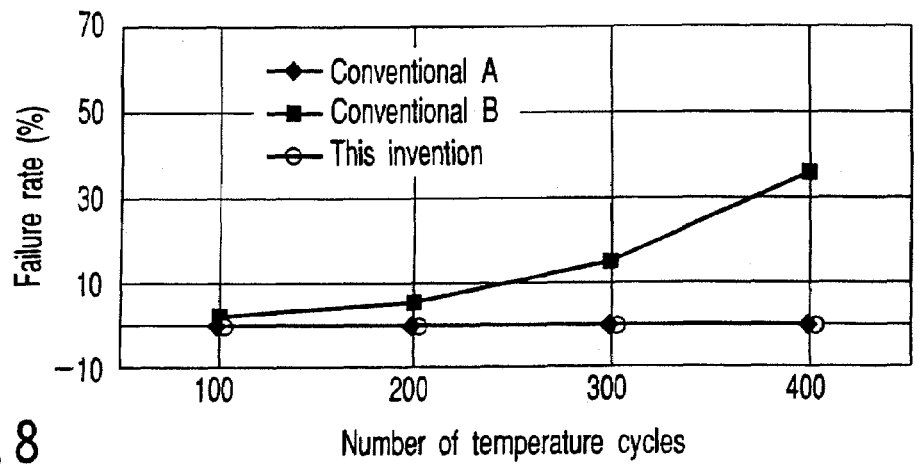
FIG. 8 is a graph showing a comparison in reliability between the current path material in FIG. 4 and two conventional current path materials in a temperature cycle test.

FIG. 8 is a graph showing the results of the temperature cycle test. As represented by ○ and the solid line in FIG. 8, the MOSFET 1 of the present invention has a failure rate of 0% at which brittleness, cracking, or the like occurs, regardless of the number of temperature cycles. Similarly, as represented by ◆ and the solid line in FIG. 8, the MOSFET 101 (conventional A) having the Au bonding wire has a failure rate of 0% at which brittleness, cracking, or the like occurs, regardless of the number of temperature cycles. However, as represented by ■ and the solid line in FIG. 8, the conventional MOSFET (conventional B) having the soldered Cu strap increases in failure rate as the number of temperature cycles increases.

As described above, in the MOSFET 1 according to the first embodiment, the wiring resistance of the Al bonding strap 6 is reduced by about 80% from that of the conventional MOSFET 101 having Au bonding. The influence of the wiring resistance on the ON resistance of the overall MOSFET 1 is very weak. The MOSFET 1 having the supersonically bonded Al bonding strap 6 is stable without degrading the reliability of the electrical performance upon abrupt temperature changes. The MOSFET 1 exhibits much higher reliability with respect to temperature changes than that of the conventional MOSFET having the soldered Cu strap.

In the MOSFET 1 of this embodiment, the Al bonding strap 6 is simultaneously bonded to the source electrode 4s and the source side post 7s of the lead frame by one supersonic bonding. The bonding strengths at the two bonding portions can be easily made equal. Even if changes in external environment such as temperature changes, metal fatigue, or the like occur at the bonding portions, the stress can be uniformly dispersed. The MOSFET 1 greatly improves the endurance at the bonding portions between the Al bonding strap 6, and the source electrode 4s and source side post 7s.

The MOSFET 1 of the first embodiment is lower in power consumption than a conventional power MOSFET. The MOSFET 1 operates at high speed, and has stable electrical performance, high endurance, and a long service life.

Second Embodiment

The second embodiment will be described with reference to FIGS. 9A to 9E and 10A to 10C. The second embodiment will explain a semiconductor device manufacturing method according to the first embodiment by exemplifying a MOSFET 1.

In the method of manufacturing the MOSFET 1, at least one electrode (e.g., source electrode 4s) out of a plurality of electrodes of a semiconductor element 5, and at least one post (e.g., source side post 7s) out of a plurality of lead frame posts are directly bonded to an electrode side bonding portion 6a and post side bonding portion 6b at the two end portions of a flat plate-like Al bonding strap 6. A middle portion 6c of the Al bonding strap 6 is spaced apart from the upper surface of the semiconductor element 5.

The Al bonding strap 6 is directly bonded to the source electrode 4s and source side post 7s simultaneously by supersonic bonding. First, as shown in FIGS. 9A to 9E, an Al bonding strap 6 with a desired size and shape is manufactured.

Figure 9A:
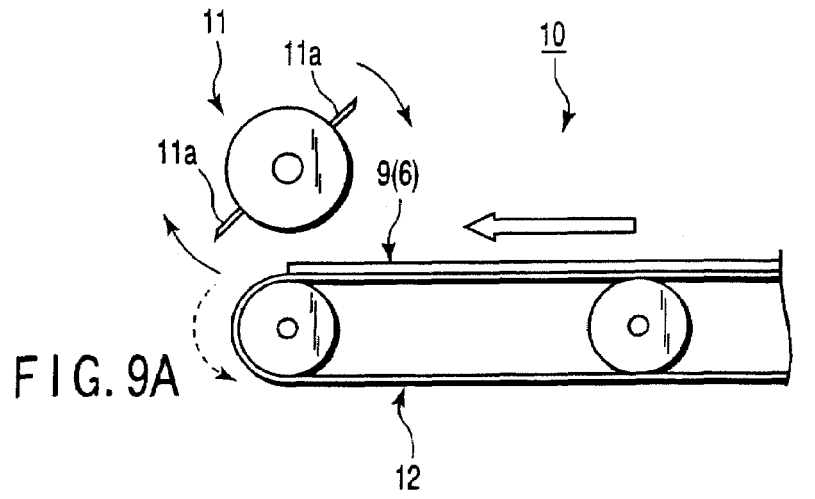
FIG. 9A is a view showing a state before a current path material in the second embodiment is cut out.
Figure 9B:
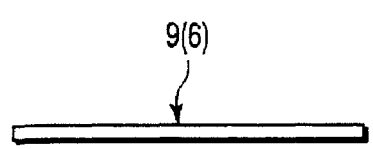
FIG. 9B is a view showing a state after the current path material in the second embodiment is cut out from the material.

More specifically, an Al plate 9 which is rolled into a thin flat plate and serves as the material of the Al bonding strap 6 is cut out into a predetermined size (length) by, e.g., a cutting machine 10 shown in FIG. 9A. The cutting machine 10 is constituted by a rotary cutter 11 for cutting the Al plate 9, and a belt conveyor 12 for conveying the Al plate 9. The belt conveyor 12 rotates in a direction indicated by the broken arrow in FIG. 9A. The Al plate 9 is conveyed by the belt conveyor 12 in a direction indicated by the outline arrow.

The rotary cutter 11 is disposed near the end of the belt conveyor 12, and rotates in the solid arrows in FIG. 9A. The rotary cutter 11 has two rotatable sharp edges 11a. The Al plate 9 conveyed to the end of the belt conveyor 12 is cut out by the sharp edges 1a into a predetermined size shown in FIG. 9B.

Figure 9D:
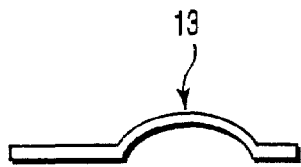
FIG. 9D is a view showing a state wherein the current path material in the second embodiment is formed into another shape.
Figure 9C:
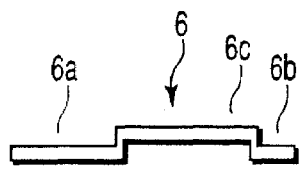
FIG. 9C is a view showing a state wherein the current path material in the second embodiment is formed into a shape used in the semiconductor device of FIG. 4.

The Al plate 9 cut out into the predetermined size is formed by a forming machine (not shown) such that the middle portion 6c projects from the electrode side bonding portion 6a (e.g., bonding portion on the source electrode 4s side) and the post side bonding portion 6b (e.g., bonding portion to the source side post), as shown in the side view of FIG. 9C. The Al plate 9 cut out into the predetermined size is formed by the forming machine as the Al bonding strap 6 having a predetermined shape for the MOSFET 1.

Figure 9E:
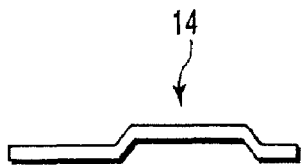
FIG. 9E is a view showing a state wherein the current path material in the second embodiment is formed into still another shape.

By exchanging forming dies in the forming machine, the Al plate 9 cut out into the predetermined size can be formed as Al bonding straps 13 and 14 having various shapes, as shown in FIGS. 9D and 9E.

Figure 10A:
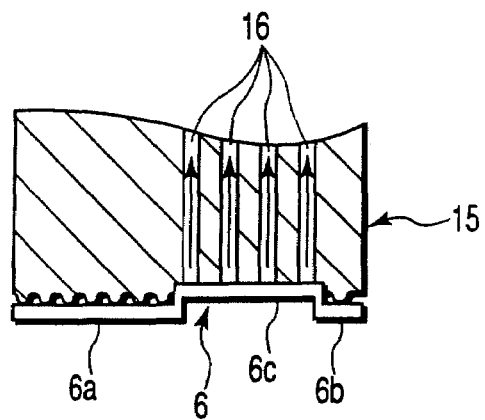
FIG. 10A is a view showing a state wherein the current path material of FIG. 9C in the second embodiment is vacuum-held by a bonding horn.

The Al bonding strap 6 formed into the predetermined shape is bonded to the source electrode 4s of the semiconductor element 5 and a source side post 7s. As a bonding jig, e.g., a bonding horn 15 shown in FIG. 10A is used to hold the Al bonding strap 6. A plurality of vacuum holes 16 are formed inside the bonding horn 15, and the Al bonding strap 6 is evacuated and held in a direction indicated by the solid arrows in FIG. 10A. A plurality of nonskid corrugations are formed on the lower surface of the bonding horn 15 that contacts the Al bonding strap 6.

Figure 10B:
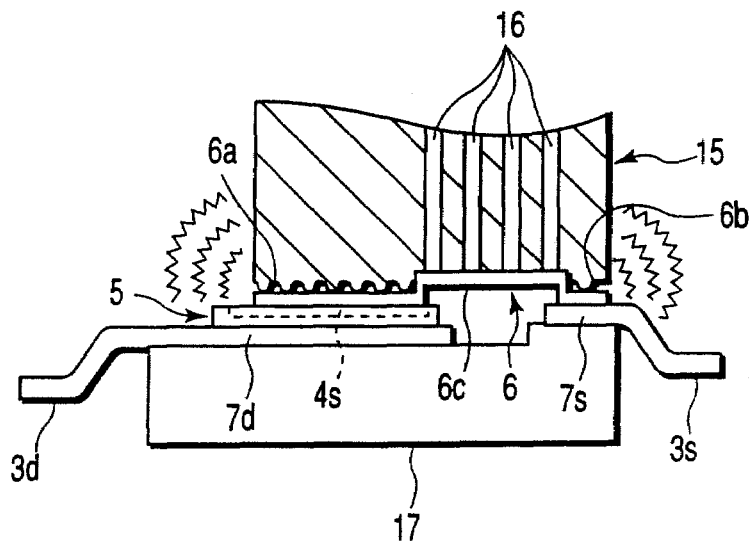
FIG. 10B is a view showing a state wherein the current path material of FIG. 10A in the second embodiment is supersonically bonded to a source electrode 4s of a semiconductor element and a source side post 7s simultaneously.

As shown in FIG. 10B, a drain side lead frame terminal 3d, source side lead frame terminal 3s, and gate side lead frame terminal 3g of the MOSFET 1 are set at predetermined positions on a bonding table 17 in advance. The semiconductor element 5 is die-bonded to a drain side post 7*d* in advance by using a cured conductive material or solder so as to make a source electrode 4*s* face up.

The Al bonding strap 6 held by the bonding horn 15 is simultaneously bonded to the source electrode 4*s* of the semiconductor element 5 and the source side post 7*s* which are set in the above fashion. The bonding horn 15 is connected to a supersonic wave generator (not shown). The maximum frequency of supersonic waves which can be generated by the supersonic wave generator is about 60 kHz. In a general use state, supersonic waves having a frequency of about 38 kHz are generated. By generating such supersonic waves, the bonding horn 15 can supersonically bond the Al bonding strap 6 to the source electrode 4*s* of the semiconductor element 5 and the source side post 7*s* simultaneously.

While the bonding horn 15 holds the Al bonding strap 6, it comes close to the source electrode 4*s* of the semiconductor element 5 and the source side post 7*s* from above. It is confirmed whether the Al bonding strap 6 is set at a proper bonding position. After that, while the Al bonding strap 6 is kept held by the bonding horn 15, it is brought into direct contact with the source electrode 4*s* of the semiconductor element 5 and the source side post 7*s* from above.

While this contacting state is kept, the supersonic wave generator of the bonding horn 15 is operated to supersonically directly bond the electrode side bonding portion 6*a* of the Al bonding strap 6 to the source electrode 4*s* of the semiconductor element 5 and the post side bonding portion 6*b* of the Al bonding strap 6 to the source side post 7*s* simultaneously, as shown in FIG. 10B.

Figure 10C:
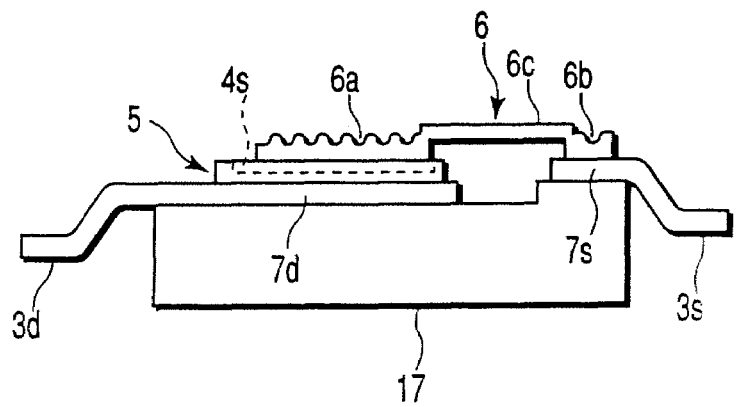
FIG. 10C is a view showing a state wherein the current path material of FIG. 9C in the second embodiment is supersonically bonded to the source electrode 4s of the semiconductor element and the source side post 7s simultaneously.

After supersonic bonding of the Al bonding strap 6 ends, as shown in FIG. 10C, a gate electrode 4*g* of the semiconductor element 5 and a gate side post 7*g* shown in FIG. 5A are electrically connected by a bonding wire 8 made of a metal such as Al or Au. The bonding wire 8 may be connected by supersonic bonding similarly to the Al bonding strap 6, or by using a cured conductive material, solder, or the like.

Subsequently, the semiconductor element 5 bonded by the Al bonding strap 6, the lead frame, the bonding wire 8, and the like are packaged using a mold resin such as an epoxy series resin so as to cover them. The semiconductor element 5, lead frame, bonding wire 8, and the like are stored in a housing 2. After the housing 2 is molded into a predetermined shape, the lead frame terminal 3 is cut into a predetermined length, obtaining the MOSFET 1 sealed into a desired SOP-8 package.

According to the above-described semiconductor device manufacturing method of the second embodiment, the Al bonding strap 6 can be directly bonded to the source electrode 4*s* of the semiconductor element 5 and the source side post 7*s* by supersonic bonding without using any cured conductive material, solder, or the like.

The second embodiment can provide a stable semiconductor device in which the resistance between the source electrode 4*s* and the source side post 7*s* and the ON resistance (internal resistance) of the entire device are low, high-speed operation is realized with low power consumption, and the endurance with respect to changes in external environment such as temperature changes and the reliability of the electrical performance are high.

According to the semiconductor device manufacturing method of this embodiment, the source electrode 4*s* of the semiconductor element 5 and the source side post 7*s* are simultaneously supersonically bonded to the two end portions (6*a* and 6*b*) of the Al bonding strap 6, increasing the bondability. This can increase the manufacturability of the whole semiconductor device (MOSFET 1) and shorten the time taken to manufacture the MOSFET 1.

According to the prototype production by the present inventors, the time taken to manufacture one MOSFET 1 (one package) having the Al bonding strap 6 by the manufacturing method of the second embodiment was shortened by about 40% per production machine (not shown) in comparison with the time taken to manufacture one MOSFET 101 having conventional Au bonding. As a result, in mass production of the MOSFET 1 having the Al bonding strap 6, the manufacturing cost per MOSFET 1 can be decreased as the number of MOSFETs to be manufactured increases. This is advantageous for the cost competition in the market place.

In the conventional MOSFET 101, about 10 of 60-µm φ bonding wires must be set at proper positions and bonded to the source electrode 4*s* and source side post 7*s*. To the contrary, when a MOSFET 1 is to be manufactured using the semiconductor device manufacturing method of the second embodiment, an Al bonding strap 6 having a width of 2.0 mm and a thickness of 0.1 mm can be simultaneously bonded to the source electrode 4*s* and source side post 7*s* by one supersonic bonding. The bonding failure generation rate of the Al bonding strap 6 in manufacturing the MOSFET 1 can be reduced to about 1/10 the bonding failure generation rate of Au bonding formed from 10 bonding wires.

The manufacturing method of this embodiment can greatly increase the yield of the MOSFET 1 in comparison with the conventional manufacturing method. The time taken to manufacture the MOSFET 1 can be shortened, as described above. In addition, the manufacturability (index) of the MOSFET 1 can also be significantly increased.

The semiconductor device manufacturing method of the second embodiment simultaneously bonds the two end portions (6*a* and 6*b*) of the Al bonding strap 6 to the source electrode 4*s* and the source side post 7*s* by one supersonic bonding. Even if changes in external environment such as temperature changes, metal fatigue, or the like occurs at the bonding portions, the stress can be uniformly dispersed. The manufacturing method of this embodiment can greatly improve the endurance at the bonding portions between the Al bonding strap 6, and the source electrode 4*s* and source side post 7*s*.

Third Embodiment

A semiconductor device and a method of manufacturing the same according to the third embodiment will be described with reference to FIG. 11. The third embodiment will explain the structure and manufacturing method of a MOSFET 21.

Figure 11:
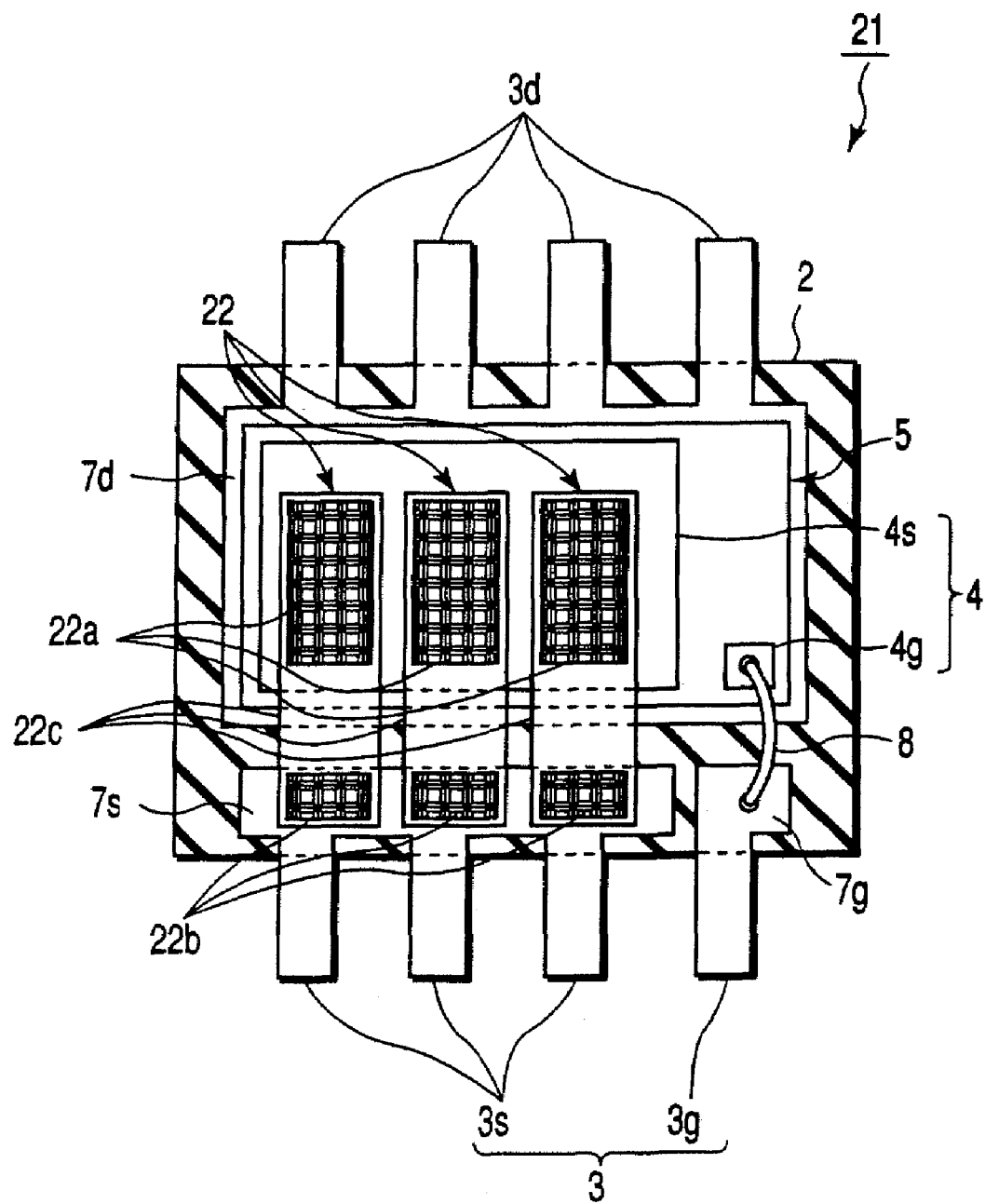
FIG. 11 is a sectional view showing the internal structure of a semiconductor device according to the third embodiment taken along the line A-A.

The MOSFET 21 shown in FIG. 11 has the same structure, operation, and effects as those in the MOSFET 1 of the first embodiment except that the size, shape, and number of Al bonding straps 22 connected to a source electrode 4*s* of a semiconductor element 5 and a source side post 7*s* are different from those of the Al bonding strap 6 in the first embodiment described above. The same reference numerals denote the same parts, a description thereof will be omitted, and only a difference will be explained.

As shown in FIG. 11, in the MOSFET 21, the source electrode 4*s* of the semiconductor element 5 and the source side post 7*s* are connected using a plurality of (three in FIG. 11) Al bonding straps 22 each formed into an elongated plate. An electrode side bonding portion 22*a* of each Al bonding strap 22 is directly supersonically bonded to the source electrode 4s of the semiconductor element 5 simultaneously when a post side bonding portion 22b of the Al bonding strap 22 is directly supersonically bonded to the source side post 7s.

Since the MOSFET 21 and its manufacturing method are the same as the MOSFET 1 and its manufacturing method in the first embodiment except for the above-described difference, the object of the present invention can be achieved. Moreover, the MOSFET 21 in which the source electrode 4s of the semiconductor element 5 and the source side post 7s are connected by a plurality of Al bonding straps 22 each formed into an elongated plate, as described above, and the method of manufacturing the MOSFET 21 exhibit the following advantages.

In the MOSFET 21, the source electrode 4s of the semiconductor element 5 and the source side post 7s are connected by the three elongated plate-like Al bonding straps 22. Compared to the MOSFET 1, the amount of material such as Al used for the Al bonding straps 22 can be reduced without decreasing the flow rate of a current flowing between the source electrode 4s and the source side post 7s. The MOSFET 21 of the third embodiment can be manufactured at lower cost with higher electrical performance than those of the conventional MOSFET 101.

The three Al bonding straps 22 are set such that their size, shape, and layout and the number of Al bonding straps 22 do not greatly degrade the conductance between the source electrode 4s and the source side post 7s. More specifically, the three Al bonding straps 22 are set such that the three parallel wiring resistances hold almost the same magnitude as the wiring resistance of the Al bonding strap 6 in the above-described first embodiment.

In the Al bonding straps 22 of the third embodiment formed by substantially dividing the Al bonding strap 6 in the first embodiment into three, the magnitude of the three parallel wiring resistances is greatly reduced by about 80% from the wiring resistance of the MOSFET 101 having conventional Au bonding, similar to the magnitude of the wiring resistance of the Al bonding strap 6. Also in the MOSFET 21, the influence of the wiring resistance of the three parallel Al bonding straps 22 on the ON resistance of the entire MOSFET 21 is very weak.

Fourth Embodiment

A semiconductor device and a method of manufacturing the same according to the fourth embodiment will be described with reference to FIG. 12. The fourth embodiment will explain the structure and manufacturing method of a MOSFET 31.

Figure 12:
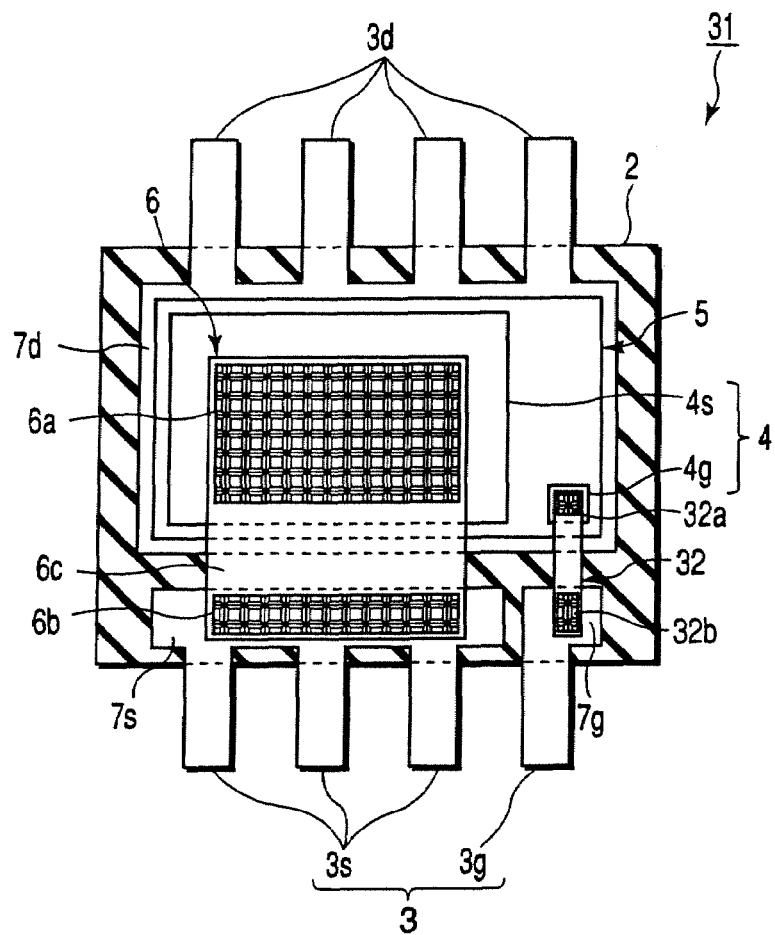
FIG. 12 is a sectional view showing the internal structure of a semiconductor device according to the fourth embodiment taken along the line A-A.

The MOSFET 31 and its manufacturing method shown in FIG. 12 are different from the MOSFET 1 and its manufacturing method in the first embodiment in that a gate electrode 4g of the semiconductor element 5 and a gate side post 7g are electrically connected by one elongated plate-like Al bonding strap 32, similar to a source electrode 4s of a semiconductor element 5 and a source side post 7s. The remaining structure, operation, and effects are the same as those in the first embodiment. The same reference numerals denote the same parts, a description thereof will be omitted, and only a difference will be explained.

As shown in FIG. 12, in the MOSFET 31, the gate electrode 4g of the semiconductor element 5 and the gate side post 7g are connected to each other by using one elongated plate-like Al bonding strap 32. An electrode side bonding portion 32a of the Al bonding strap 32 is directly supersonically bonded to the gate electrode 4g of the semiconductor element 5 simultaneously when a post side bonding portion 32b of the Al bonding strap 32 is directly supersonically bonded to the gate side post 7g.

Since the MOSFET 31 and its manufacturing method are the same as the MOSFET 1 and its manufacturing method in the first embodiment except for the above-described difference, the object of the present invention can be achieved. As described above, the gate electrode 4g of the semiconductor element 5 and the gate side post 7g are connected by one elongated plate-like Al bonding strap 32. The MOSFET 31 and its manufacturing method have the following advantages.

In the MOSFET 31, the source electrode 4s of the semiconductor element 5 and the source side post 7s are bonded by a plate-like Al bonding strap 6. In addition, the gate electrode 4g of the semiconductor element 5 and the gate side post 7g are connected by one elongated plate-like Al bonding strap 32.

This structure can increase the flow rate of a current flowing between the semiconductor element 5 and the lead frame. The MOSFET 31 can be further improved in electrical performance than the MOSFET 1.

Fifth Embodiment

A semiconductor device and a method of manufacturing the same according to the fifth embodiment will be described with reference to FIG. 13. The fifth embodiment will explain the structure and manufacturing method of a MOSFET 41.

Figure 13:
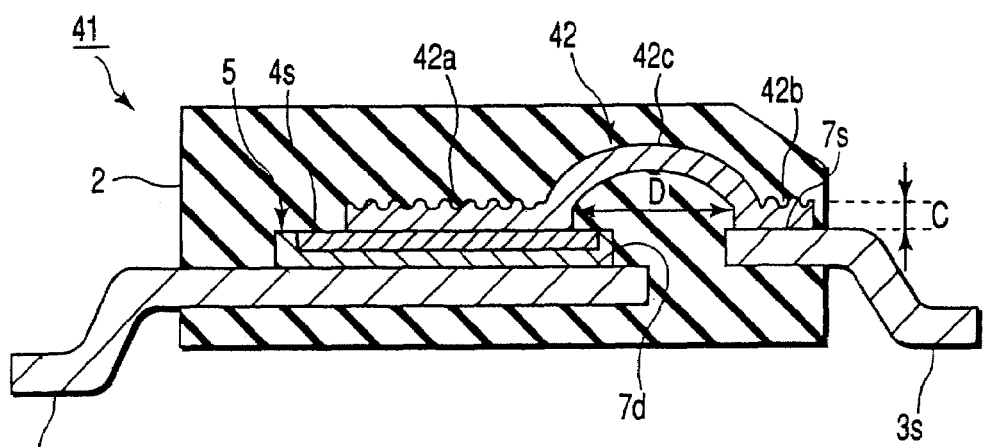
FIG. 13 is a sectional view showing the internal structure of a semiconductor device according to the fifth embodiment taken along the line B-B.

The MOSFET 41 and its manufacturing method shown in FIG. 13 have the same structure, operation, and effects as those in the first embodiment except that the shape of an Al bonding strap 42 bonded to a source electrode 4s of a semiconductor element 5 and a source side post 7s is different from that of the Al bonding strap 6 of the MOSFET 1 in the first embodiment. The same reference numerals as in the first embodiment denote the same parts, a description thereof will be omitted, and only a difference will be explained.

As shown in FIG. 13, in the MOSFET 41, a middle portion (beam portion) 42c between an electrode side bonding portion 42a and post side bonding portion 42b of the Al bonding strap 42 that are respectively bonded to the source electrode 4s of the semiconductor element 5 and the source side post 7s is formed into an arch shape having a predetermined curvature.

More specifically, a thickness C of the Al bonding strap 42 shown in FIG. 13 is about 0.1 mm, and an interval D of the middle portion 42c is about 0.6 mm. As shown in the sectional view of FIG. 13, the middle portion 42c is so arched as to draw a smooth semicircular arc.

In the method of manufacturing the MOSFET 41, the Al bonding strap 42 can be easily formed from an Al plate 9 cut out into a predetermined length by merely exchanging dies for forming a bonding strap in the step of forming the Al bonding strap 6 of the first embodiment, as described above with reference to FIG. 9C.

Also in the Al bonding strap 42, the electrode side bonding portion 42a and post side bonding portion 42b are directly bonded to the source electrode 4s of the semiconductor element 5 and the source side post 7s simultaneously by supersonic bonding.

Since the structure and manufacturing method of the MOSFET 41 are the same as those of the MOSFET 1 in the first embodiment except that the Al bonding strap 42 is arched, the object of the present invention can be achieved.

As described above, the source electrode 4s of the semiconductor element 5 and the source side post 7s are connected by the Al bonding strap 42 whose middle portion (beam portion) 42c has an arch shape with a predetermined curvature. This provides the following advantages.

In the MOSFET 41, an electrical short-circuit by a chip edge touch or the like does not occur between the electrode side bonding portion 42a of the Al bonding strap 42 and the peripheral portion of the source electrode 4s of the semiconductor element 5. The fifth embodiment can, therefore, manufacture the MOSFET 41 with stabler electrical performance.

Sixth Embodiment

A semiconductor device and a method of manufacturing the same according to the sixth embodiment will be described with reference to FIGS. 14A and 14B. The sixth embodiment will explain the structure and manufacturing method of a MOSFET 51.

The MOSFET 51 and its manufacturing method have the same structure, operation, and effects as those in the first embodiment except that the shape of an Al bonding strap 52 bonded to a source electrode 4s of a semiconductor element 5 and a source side post 7s is different from that of the Al bonding strap 6 in the first embodiment. The same reference numerals as in the first embodiment denote the same parts, a description thereof will be omitted, and only a difference will be explained.

Figure 14A:
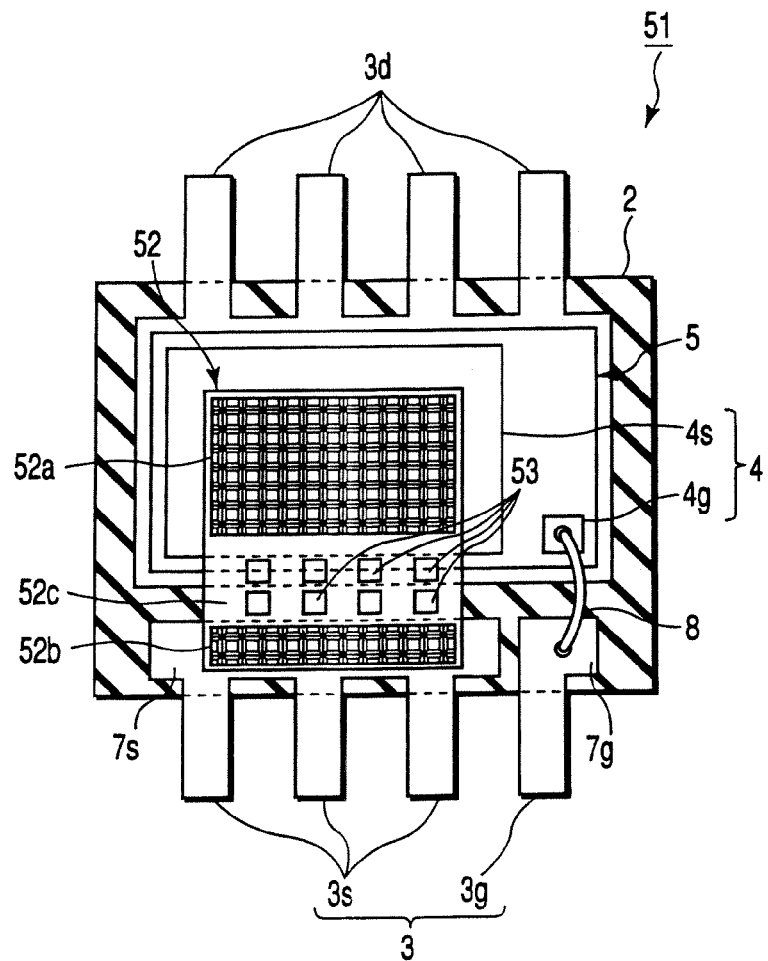
FIG. 14A is a sectional view showing the internal structure of a semiconductor device according to the sixth embodiment taken along the line A-A.
Figure 14B:
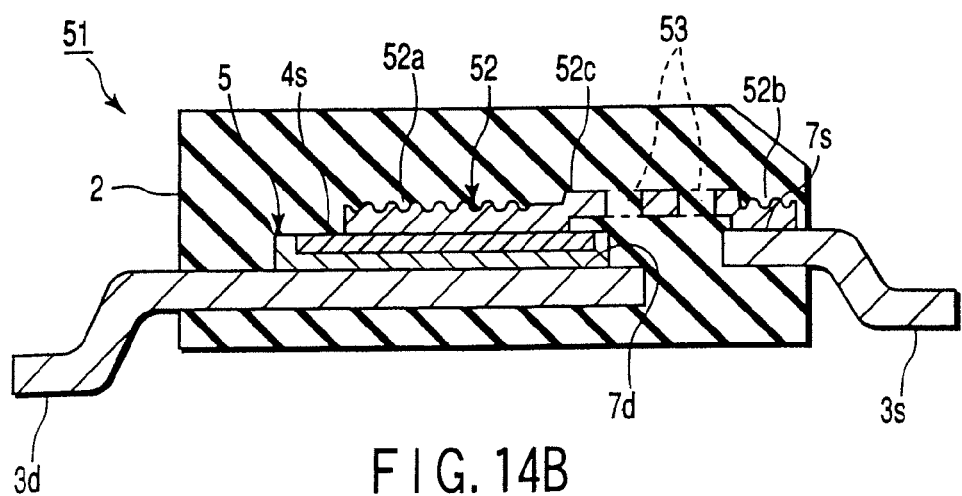
FIG. 14B is a sectional view showing the internal structure of the semiconductor device according to the sixth embodiment taken along the line B-B.

As shown in FIGS. 14A and 14B, in the MOSFET 51, the Al bonding strap 52 is used as a current path material for connecting the source electrode 4s of the semiconductor element 5 and the source side post 7s. A plurality of (eight in FIG. 14A) holes 53 which extend through a middle portion 52c along the direction of thickness of the Al bonding strap 52 are formed in the middle portion (beam portion) 52c between an electrode side bonding portion 52a and post side bonding portion 52b of the Al bonding strap 52 in order to pass a sealing resin (mold material of a housing 2) having flowability before it solidifies. In the sixth embodiment, the eight holes 53 are formed in a rectangular shape.

In the method of manufacturing the MOSFET 51, the Al bonding strap 52 can be easily formed from an Al plate 9 cut out into a predetermined length by merely exchanging dies for forming a strap in the step of forming the Al bonding strap 6 of the first embodiment, as described above with reference to FIG. 9C.

In the method of manufacturing the MOSFET 51, the electrode side bonding portion 52a and post side bonding portion 52b of the Al bonding strap 52 are directly bonded to the source electrode 4s of the semiconductor element 5 and the source side post 7s simultaneously by supersonic bonding.

Since the MOSFET 51 and its manufacturing method in the sixth embodiment are the same as the MOSFET 1 and its manufacturing method in the first embodiment except for the above-described difference, the object of the present invention can be achieved. As described above, the eight rectangular holes 53 for passing a sealing resin with flowability are so formed as to extend through the middle portion 52c in the direction of thickness in the Al bonding strap 52 which connects the source electrode 4s of the semiconductor element 5 and the source side post 7s. The MOSFET 51 and its manufacturing method exhibit the following advantages.

According to the method of manufacturing the MOSFET 1 in the first embodiment, the semiconductor element 5 bonded by the Al bonding strap 6, the lead frame, the bonding wire 8, and the like are packaged using a sealing resin (molding resin) such as an epoxy series resin so as to cover them. The semiconductor element 5, lead frame, bonding wire 8, and the like are stored in the housing 2 to manufacture the MOSFET 1 sealed into an SOP-8 package.

The Al bonding strap 6 of the first embodiment and the Al bonding strap 52 of the sixth embodiment are both made of Al. Their adhesion to an epoxy series resin or the like generally used as a mold resin is low.

When the Al bonding strap 6 formed into a plate is so packaged as to be covered by the epoxy series resin, a slit is formed between the Al bonding strap 6 and the housing 2. A crack may be generated from the outside to inside of the housing 2.

Any slit or crack between the Al bonding strap 6 and the housing 2 may allow moisture or the like to enter the housing 2 from the outside. The moisture or the like may generate an electrical short-circuit or rust between the Al bonding strap 6 and the semiconductor element 5 or lead frame, greatly degrading the electrical performance of the MOSFET 1. In some cases, the MOSFET 1 completely fails to operate.

In the MOSFET 51 of the sixth embodiment, the source electrode 4s of the semiconductor element 5 and the source side post 7s are connected by the plate-like Al bonding strap 52. The eight rectangular holes 53 are formed in the middle portion 52c of the Al bonding strap 52 so as to extend through it in the direction of thickness.

When the semiconductor element 5 connected by the Al bonding strap 52, the lead frame terminal 3, the bonding wire 8, and the like are packaged by an epoxy series resin so as to cover them, the epoxy series resin passes through the eight rectangular holes 53 formed in the middle portion 52c of the Al bonding strap 52. The epoxy series resin adheres the Al bonding strap 52 from the periphery so as to uniformly surround it without any gap. The semiconductor element 5, lead frame terminal 3, bonding wire 8, and the like can be stored in the housing 2.

In this manner, the eight rectangular holes 53 are formed in the middle portion 52c of the Al bonding strap 52. This can improve the adhesion between the Al bonding strap 52 and the epoxy series resin in the housing 2 of the MOSFET 51, avoid entrance of moisture into the housing 2 of the MOSFET 51, and greatly improve the moisture resistance. The sixth embodiment can manufacture a MOSFET 51 which has higher endurance against the external environment and is excellent in stability of electrical performance and reliability.

As described above, the eight rectangular holes 53 formed in the middle portion 52c of the Al bonding strap 52 can be called packaging facilitation holes in terms of their effects. The eight rectangular holes 53 have such a size, shape, number of holes, and layout as not to greatly degrade the conductance of the Al bonding strap 52.

More specifically, these eight rectangular holes 53 are set such that the wiring resistance of the Al bonding strap 52 becomes almost equal to that of the Al bonding strap 6 of the above-described first embodiment. Similar to the wiring resistance of the Al bonding strap 6, the magnitude of the wiring resistance in the Al bonding strap 52 with the eight rectangular holes 53 formed in the middle portion 6c of the Al bonding strap 6 of the first embodiment is reduced by about 80% from the wiring resistance of the MOSFET 101 using conventional Au bonding. Also in the MOSFET 51, the influence of the wiring resistance of the Al bonding strap 52 having the eight rectangular holes 53 on the ON resistance of the entire MOSFET 51 is very weak.

The bonding strap used in the MOSFET 51 of the sixth embodiment is not necessarily limited to the Al bonding strap 52. For example, as shown in FIGS. 15A to 15E, various bonding straps can be adopted as far as a low ON resistance value of the strap can be held.

Figure 15A:
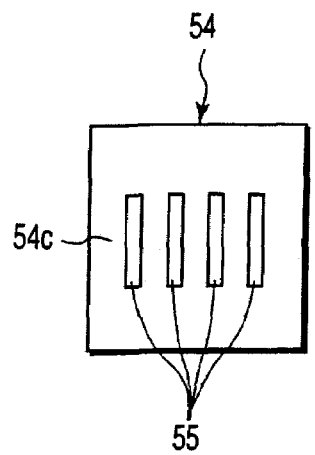
FIG. 15A is a view showing a current path material having four slits in the semiconductor device of FIGS. 14A and 14B.

An Al bonding strap 54 shown in FIG. 15A has four slit-like holes 55 formed in a middle portion 54c along the direction in which the source electrode 4s of the semiconductor element 5 and the source side post 7s are connected.

Figure 15B:
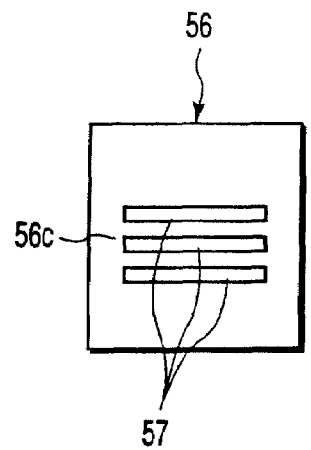
FIG. 15B is a view showing a current path material having three slits in the semiconductor device of FIGS. 14A and 14B.

An Al bonding strap 56 shown in FIG. 15B has three slit-like holes 57 formed in a middle portion 56c perpendicularly to the direction in which the source electrode 4s of the semiconductor element 5 and the source side post 7s are connected.

Figure 15C:
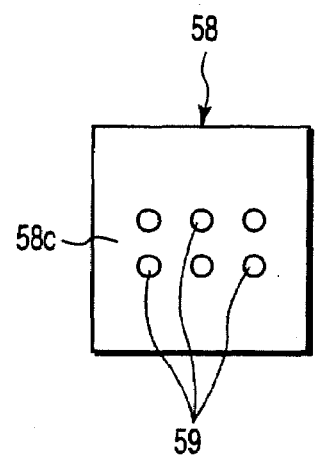
FIG. 15C is a view showing a current path material having six small circular holes in the semiconductor device of FIGS. 14A and 14B.

An Al bonding strap 58 shown in FIG. 15C has six small circular holes 59 formed in a middle portion 58c.

Figure 15D:
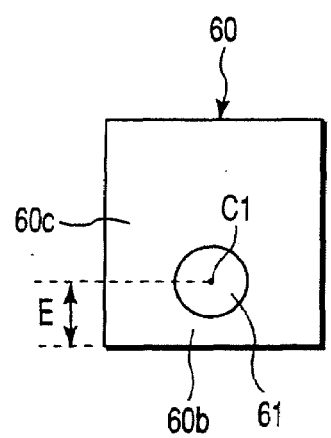
FIG. 15D is a view showing a current path material having one circular hole in the semiconductor device of FIGS. 14A and 14B.

An Al bonding strap 60 shown in FIG. 15D has a 0.8-mm$\phi$ circular hole formed in a middle portion 60c. As represented by E in FIG. 15D, a circular hole 61 is formed at a position where its center $C_1$, is spaced apart by 1.1 mm from the end of a post side connecting portion 60b of the Al bonding strap 60.

Figure 15E:
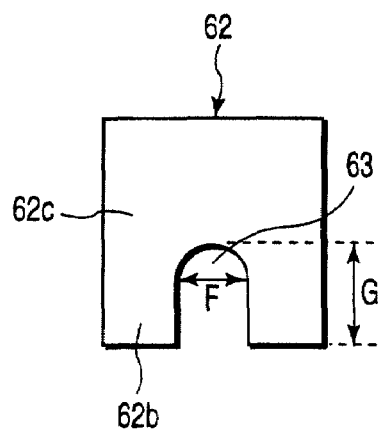
FIG. 15E is a view showing a current path material having a semicircular hole and notch in the semiconductor device of FIGS. 14A and 14B.

An Al bonding strap 62 shown in FIG. 15E has a 0.8-mm$\phi$ semicircular hole 63 formed in a middle portion 62c. A notch 0.8 mm in width equal to the diameter of the semicircular hole 63 is formed from the semicircular hole 63 toward the end of a post side bonding portion 62b of the Al bonding strap 62. In the Al bonding strap 62, a portion of the semicircular hole 63 that is farthest from the end of the post side bonding portion 62b of the Al bonding strap 62 is formed at a position apart by 1.5 mm from this end, as represented by G in FIG. 15E.

The Al bonding straps 54, 56, 58, 60, and 62 with the holes 55, 57, 59, 61, and 63 having various sizes, shapes, number of holes, and layouts are so formed as to hold the magnitude of the ON resistance described above. These holes have the effects of the above-mentioned packaging facilitation holes.

The semiconductor device and the method of manufacturing the same according to the present invention are not limited to the first to sixth embodiments. Part of the structure of the semiconductor device according to the present invention or the steps of the semiconductor device manufacturing method according to the present invention can be variously combined and practiced without departing from the spirit and scope of the present invention.

For example, the method of directly connecting the electrode side bonding portion of the Al bonding strap to the source electrode 4s of the semiconductor element and the post side bonding portion of the Al bonding strap to the source side post 7s is not limited to supersonic bonding. For example, resistance welding or compression bonding may be employed.

In bonding operation, either one of the electrode side connecting portion and post side connecting portion of the Al bonding strap may be first bonded, instead of simultaneously bonding them to the source electrode 4s of the semiconductor element 5 and the source side post 7s. The material of the bonding strap may be a high-conductance metal material such as Cu or Au, other than Al.

In the first to sixth embodiments, the semiconductor element of the semiconductor device according to the present invention has a so-called one-layered structure in which one source electrode and one gate electrode are arranged on the upper surface, and one drain electrode is arranged on the back surface. However, the semiconductor element 5 can adopt a multilayered structure. If the electrode 4 to be connected to the lead frame terminal 3 is exposed on the upper or lower surface of the semiconductor element, the electrode and lead frame can be electrically connected to each other easily, selectively by the semiconductor device manufacturing method of the present invention using the Al bonding strap 6, 22, 32, 42, 52, or the like.

The number of semiconductor elements formed inside the semiconductor device may be one or a plurality of elements. The electrode of the semiconductor device according to the present invention is not limited to one per electrode type. For example, the semiconductor element of the semiconductor device may have pluralities of source electrodes, gate electrodes, and drain electrodes. Also in this case, these electrodes and the lead frame can be electrically connected to each other easily, selectively by the semiconductor device manufacturing method of the present invention using the Al bonding strap 6, 22, 32, 42, 52, or the like.

Various holes 53, 55, 57, 59, 61, and 63 formed in the plate-like Al bonding straps 52, 54, 56, 58, 60, and 62 in the sixth embodiment may be formed in the middle portions 22c of the three elongated plate-like Al bonding straps 22 in the second embodiment. These holes 53, 55, 57, 59, 61, and 63 may be formed in the arched middle portion 42c of the Al bonding strap 42 in the fifth embodiment. At this time, both the Al bonding straps 22 and 42 preferably hold the above-mentioned ON resistance value.

In the semiconductor device and the method of manufacturing the same according to the present invention, the sectional area of a current path between an electrode and a lead frame can be widened to reduce the resistance between them. Furthermore, an electrical short circuit by a chip edge touch or the like can be avoided. The possibility of making the electrical performance of the current path unstable upon changes in external environment such as temperature changes can be decreased. Hence, the present invention can provide a highly endurable semiconductor device which can operate at low power consumption and exhibits stable electrical performance.

What is claimed is:

1. A supersonic bonding apparatus using a supersonic bonding horn configured to supersonic bond a conductive plate-like member directly on an electrode member formed on a surface of a semiconductor element, comprising:
   a contact surface portion of the supersonic bonding horn, which is configured to be in contact with the plate-like member and configured to apply a supersonic vibration to the plate-like member; and
   a vacuum hole formed in the supersonic bonding horn, configured to be evacuated to hold the plate-like member on the contact surface portion.

2. A supersonic bonding apparatus according to claim 1, wherein the supersonic bonding horn has a plurality of the contact surface portions.

3. A supersonic bonding apparatus according to claim 2, wherein the vacuum hole is provided between at least two of the plurality of the contact surface portions.

4. A supersonic bonding apparatus according to claim 3, wherein the plurality of the contact surface portions have a plurality of grooves.

5. A supersonic bonding apparatus according to claim 1, further comprising:
   another contact surface portion of the supersonic bonding horn, which is configured to be in contact with the plate-like member and configured to apply a supersonic vibration to the plate-like member to supersonic bond the plate-like member directly on a lead terminal provided at a different position from the electrode member, at the same time the conductive plate-like member is supersonic bonded directly on the electrode member.

6. A supersonic bonding apparatus according to claim 5, wherein the contact surface portions have a plurality of grooves, and the vacuum hole is provided between the two contact surface portions.

7. A method of manufacturing a semiconductor device, comprising:

preparing a conductive plate-like member of a predetermined length;

vacuuming a vacuum hole formed in a supersonic bonding horn of a supersonic bonding apparatus to hold the plate-like member on and in contact with a contact surface portion of the supersonic bonding horn;

moving the supersonic bonding horn so that the plate-like member is in direct contact with an upper surface of an electrode member formed on an upper surface of an semiconductor device, while holding the plate-like member on the contact surface portion; and applying a supersonic vibration via the contact surface portion to the plate-like member to supersonic bond the plate-like member directly to the electrode member.

8. A method of manufacturing a semiconductor device according to claim 7, further comprising:

shaping the plate-like member to have a predetermined shape, after preparing the conductive plate-like member of the predetermined length, wherein, the shaped plate-like member is held on and in contact with a plurality of the contact surface portions at different positions of the supersonic bonding horn, one of at least two of the plurality of contact surface portions is held on and in direct contact with the upper surface of the electrode member, and the other of the at least two of the plurality of contact surface portions is held on and in direct contact with a lead terminal at a different position from the electrode member, and a supersonic vibration is applied via the at least two of the plurality of contact surface portions to the plate-like member to supersonic bond a portion of the plate-like member directly to the upper surface of the electrode member, and at the same time to supersonic bond another portion of the plate-like member directly to the lead terminal.

9. A method of manufacturing a semiconductor device according to claim 7, wherein the plurality of the contact surface portions has a plurality of grooves.

10. A method of manufacturing a semiconductor device according to claim 9, wherein the plate-like member is made of aluminum.

* * * * *